(12) United States Patent
Kim

(10) Patent No.: US 8,467,259 B2
(45) Date of Patent: Jun. 18, 2013

(54) SEMICONDUCTOR MEMORY DEVICE

(75) Inventor: Jong-Su Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 252 days.

(21) Appl. No.: 12/979,097

(22) Filed: Dec. 27, 2010

(65) Prior Publication Data

US 2012/0051156 A1    Mar. 1, 2012

(30) Foreign Application Priority Data

Aug. 31, 2010    (KR) .................. 10-2010-0084929

(51) Int. Cl.
*G11C 7/00* (2006.01)
(52) U.S. Cl.
USPC .............. 365/203; 365/189.09; 365/205
(58) Field of Classification Search
USPC ................. 365/203, 205, 189.09
See application file for complete search history.

(56) References Cited

U.S. PATENT DOCUMENTS

| 6,552,592 | B1 * | 4/2003 | Kuttner | 327/307 |
| 7,436,722 | B2 * | 10/2008 | Mizuno et al. | 365/203 |
| 7,630,257 | B2 * | 12/2009 | Madan et al. | 365/190 |

FOREIGN PATENT DOCUMENTS

| KR | 1019970023402 | 5/1997 |
| KR | 1020050035651 | 4/2005 |
| KR | 100668512 | 1/2007 |
| KR | 1020070021561 | 2/2007 |

OTHER PUBLICATIONS

Notice of Allowance issued by the Korean Intellectual Property Office on Sep. 18, 2012.

* cited by examiner

*Primary Examiner* — Son Dinh
(74) *Attorney, Agent, or Firm* — IP & T Group LLP

(57) ABSTRACT

A semiconductor memory device includes a pre-charger configured to pre-charge a first pair of differential bus lines SIO and SIOb to a target voltage level, an amplifier configured to amplify a signal loaded on the first pair of the differential bus lines SIO and SIOb based on a drain bias voltage Vb and transfer an amplified signal to a second pair of differential bus lines LIO and LIOb, and a drain bias voltage generator configured to generate the drain bias voltage Vb.

17 Claims, 3 Drawing Sheets

SEMICONDUCTOR MEMORY DEVICE

CROSS-REFERENCE TO RELATED APPLICATIONS

The present application claims priority of Korean Patent Application No. 10-2010-0084929, filed on Aug. 31, 2010, which is incorporated herein by reference in its entirety.

BACKGROUND OF THE INVENTION

Exemplary embodiments of the present invention relate to a semiconductor device designing technology, and more particularly, to a column path control of a semiconductor memory device.

As lines and cells constituting a semiconductor memory device get smaller, a power supply voltage thereof is lowered as well. Therefore, a semiconductor memory device that may operate in a low-voltage environment is being developed.

FIG. 1 is a block diagram showing a column path, or read path, of a conventional Dynamic Random Access Memory (DRAM) device.

Referring to FIG. 1, a read path of the DRAM device includes a pair of bit lines BL and BLb, a bit line sense amplifier (BLSA), a bus switch (SW), and a main sense amplifier (IOSA). The bit line pair BL and BLb is coupled with a memory cell C and loaded with a charge corresponding to a data of the memory cell C. The charge loaded on the bit line pair BL and BLB is sensed and amplified, and the bit line sense amplifier transfers the amplified data to a segment data bus SIO and SIOb when a column selection signal Yi is enabled. The bus switch transfers the data loaded on the segment data bus SIO and SIOb to a local data bus LIO and LIOb. The main sense amplifier senses and amplifies the data loaded on the local data bus LIO and LIOb and transfers the amplified data to a global data bus GIO.

When a selected word line WL is activated based on a row address, charges stored in the capacitors of a plurality of memory cells C coupled with the selected word line WL are loaded on the bit line pair BL and BLb. The bit line sense amplifier senses a delicate voltage difference between the bit line pair BL and BLb occurring due to the loaded charges and amplifies the delicate voltage difference.

Meanwhile, the amplified data produced by the bit line sense amplifier is transferred to the segment data bus SIO and SIOb in response to the column selection signal Yi, and the bus switch transfers the data loaded on the segment data bus SIO and SIOb to the local data bus LIO and LIOb. Then, the main sense amplifier senses and amplifies the data and transfers the amplified data to the global data bus GIO.

FIG. 2 is a circuit diagram of a conventional bus switch. Referring to FIG. 2, the conventional bus switch includes a pre-charger 20 and a switch 22. The pre-charger 20 pre-charges the segment data bus SIO and SIOb to a desired reference voltage level in response to a bit line equalizing signal BLEQ. The switch 22 selectively couples the segment data bus SIO and SIOb with the local data bus LIO and LIOb in response to a bus switching signal IOSW.

The pre-charger 20 includes a first NMOS transistor T1 having a source/drain coupled with one line of the segment data bus SIO and a bit line pre-charge voltage end VBLP and receiving the bit line equalizing signal BLEQ as a gate input, a second NMOS transistor T2 having a source/drain coupled with the other line of the segment data bus SIOb and the bit line pre-charge voltage end VBLP and receiving the bit line equalizing signal BLEQ as a gate input, and a third NMOS transistor T3 having a source/drain coupled with the segment data bus SIO and SIOb and receiving the bit line equalizing signal BLEQ as a gate input.

Also, the switch 22 includes fourth and fifth transistors T4 and T5 which have a source/drain coupled with the segment data bus SIO and SIOb and the local data bus LIO and LIOb and receiving the bus switching signal IOSW as a gate input.

In a pre-charge mode when the bit line equalizing signal BLEQ is a logic high level, the pre-charger 20 equally pre-charges the segment data bus SIO and SIOb to the level of the bit line pre-charge voltage VBLP. Subsequently, in a read operation mode when the bit line equalizing signal BLEQ is enabled to a logic low level, a data is loaded on the segment data bus SIO and SIOb, and the data of the segment data bus SIO and SIOb is transferred to the local data bus LIO and LIOb through the switch 22 in response to the bus switching signal IOSW.

Here, the data is loaded on the segment data bus SIO and SIOb in a state that the segment data bus SIO and SIOb is pre-charged because an NMOS transistor (not shown), which receives the column selection signal Yi as a gate input, is turned on and the charges of the data are transferred to the segment data bus SIO and SIOb.

However, since the column selection signal Yi is a pulse signal activated to a logic high level for a short duration, the charge amount loaded on the segment data bus SIO and SIOb during such a short duration may not be sufficient to amplify the pre-charged voltage level of the segment data bus SIO and SIOb to a logic high/low level.

Therefore, when the bus switching signal IOSW is enabled to a logic high level, a delay occurs in driving the data of the segment data bus SIO and SIOb to the local data bus LIO and LIOb by the fourth and fifth NMOS transistors T4 and T5 of the switch 22. The delay may decrease the operation speed of the DRAM device.

SUMMARY OF THE INVENTION

An exemplary embodiment of the present invention is directed to a semiconductor memory device that may decrease a delay occurring when a data is transferred between differential data buses.

Another exemplary embodiment of the present invention is directed to a semiconductor memory device that may decrease a delay occurring when a data is transferred from a segment data bus to a local data bus.

In accordance with an exemplary embodiment of the present invention, a semiconductor memory device includes: a pre-charger configured to pre-charge a first pair of differential bus lines and to a target voltage level; an amplifier configured to amplify a signal loaded on the first pair of the differential bus lines and based on a drain bias voltage and transfer an amplified signal to a second pair of differential bus lines and; and a drain bias voltage generator configured to generate the drain bias voltage.

In accordance with another exemplary embodiment of the present invention, a semiconductor memory device includes: a pre-charger configured to pre-charge first and second lines of a first bus to a target voltage level; a first NMOS transistor including a gate and a source coupled in common with the first line of the first bus and a first line of a second bus and further including a drain to receive a drain bias voltage; a second NMOS transistor including a gate and a source coupled in common with the second line of the first bus and a second line of the second bus and further including a drain to receive the drain bias voltage as a drain input; and a drain bias voltage generator configured to generate the drain bias voltage.

The first bus may comprise a segment data bus and the second bus may comprise a local data bus.

DESCRIPTION OF SPECIFIC EMBODIMENTS

Figure 1:
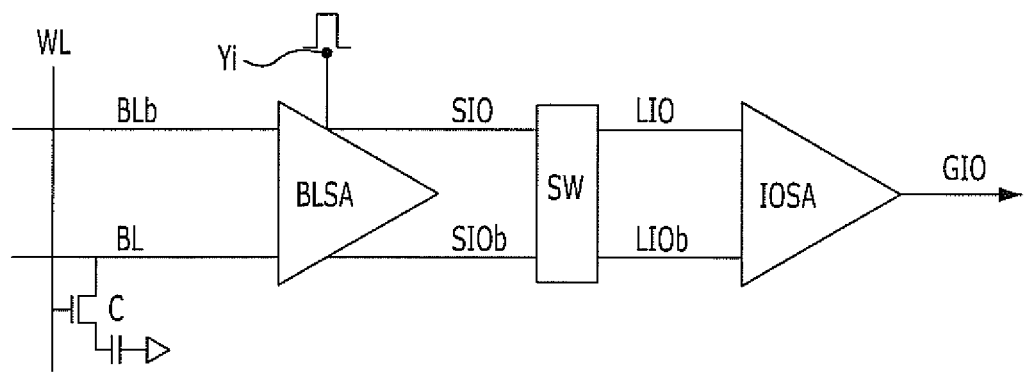
FIG. 1 is a block diagram showing a column path, or read path, of a conventional Dynamic Random Access Memory (DRAM) device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
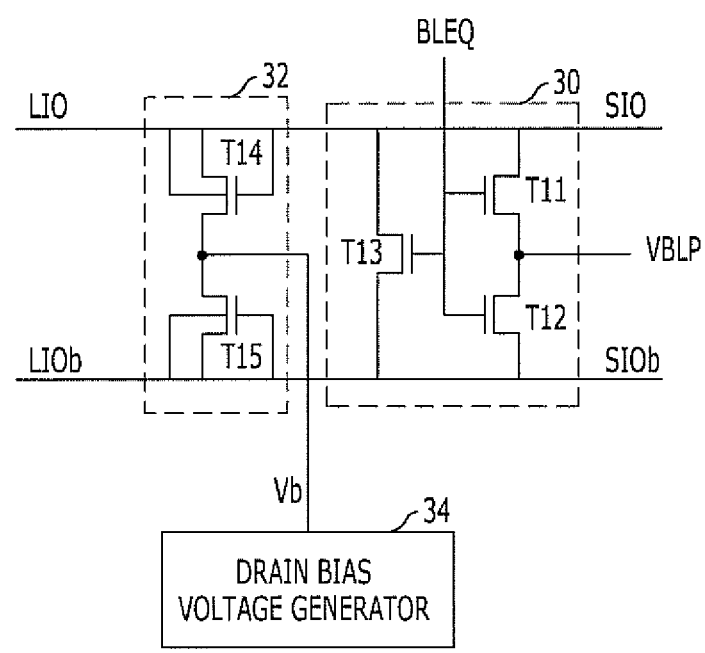
FIG. 3 is a circuit diagram of a bus switch in accordance with an embodiment of the present invention.

FIG. 3 is a circuit diagram of a bus switch in accordance with an embodiment of the present invention.

Referring to FIG. 3, the bus switch according to the embodiment of the present invention includes a pre-charger 30, an amplifier 32, and a drain bias voltage generator 34. The pre-charger 30 pre-charges a segment data bus SIO and SIOb to a desired reference voltage level in response to a bit line equalizing signal BLEQ. The amplifier 32 amplifies a data loaded on the segment data bus SIO and SIOb by using an amplifying characteristic of an ohmic region of a MOS transistor based on a drain bias voltage Vb and transfers the amplified data to a local data bus LIO and LIOb. The drain bias voltage generator 34 generates the drain bias voltage Vb.

The pre-charger 30 includes a first NMOS transistor T11 having a source/drain coupled with one line of the segment data bus SIO and a bit line pre-charge voltage end VBLP and receiving the bit line equalizing signal BLEQ as a gate input, a second NMOS transistor T12 having a source/drain coupled with the other line of the segment data bus SIOb and the bit line pre-charge voltage end VBLP and receiving the bit line equalizing signal BLEQ as a gate input, and a third NMOS transistor T13 having a source/drain coupled with the segment data bus SIO and SIOb and receiving the bit line equalizing signal BLEQ as a gate input.

The first to third NMOS transistors T11, T12, and T13 are turned on in response to the bit line equalizing signal BLEQ which is enabled to a logic high level in a pre-charge mode, and equally pre-charge the segment data bus SIO and SIOb to the voltage level of the bit line pre-charge voltage VBLP which is supplied through a drain of the first and second NMOS transistors T11 and T12.

The amplifier 32 includes a fourth NMOS transistor T14 which has a source and a gate coupled in common with one line of the segment data bus SIO and one line of the local data bus LIO and receiving the drain bias voltage Vb through a drain, and a fifth NMOS transistor T15 which has a source and a gate coupled in common with the other line of the segment data bus SIOb and the other line of the local data bus LIOb and receiving the drain bias voltage Vb through a drain.

The bodies of the fourth NMOS transistor T14 and the fifth NMOS transistor T15 are respectively coupled with one line of the segment data bus SIO and the other line of the segment data bus SIOb, and the bias values of the bodies are determined based on the voltage levels of the segment data bus SIO and SIOb.

However, even though the bodies are not coupled with the segment data bus SIO and SIOb, the bus switch according to the embodiment of the present invention may normally operate, and in some cases, the body bias may not be applied independently.

Meanwhile, the voltage level of the drain bias voltage Vb outputted from the drain bias voltage generator 34 may be targeted to a voltage level higher than a core voltage VCORE by approximately 200 mV.

In a pre-charge mode when the bit line equalizing signal BLEQ is of a logic high level, the pre-charger 30 equally pre-charges the segment data bus SIO and SIOb to the voltage level of a bit line pre-charge voltage VBLP.

Subsequently, the bit line equalizing signal BLEQ is enabled to a logic low level in a read operation mode, and when a data is loaded on the segment data bus SIO and SIOb, the data of the segment data bus SIO and SIOb is amplified by the amplifier 32 and transferred to the local data bus LIO and LIOb.

In the pre-charge mode when the segment data bus SIO and SIOb is pre-charged to the voltage level of the bit line pre-charge voltage VBLP, the voltage levels of the segment data bus SIO and SIOb are the same, and the amplifier 32 does not perform an amplification operation.

However, in the read operation mode, an NMOS transistor (not shown) which receives a column selection signal Yi as a gate input is turned on. Therefore, when the segment data bus SIO and SIOb is is loaded with charges, the voltage levels of the segment data bus SIO and SIOb are amplified into a logic high level and a logic low level.

When the voltage levels of the segment data bus SIO and SIOb are amplified to the logic high and low levels, as described above, the fourth and fifth NMOS transistors T14 and T15 perform an amplification operation, individually, and transfer the amplified data to the local data bus LIO and LIOb.

The drain bias voltage Vb is applied to the drains of the fourth and fifth NMOS transistors T14 and T15.

Generally, when a MOS transistor has a constant gate-source voltage VGS and a drain-source voltage VDS of the MOS transistor is raised, drain current ID surges drastically. The region where the drain current ID surges drastically is referred to as an Ohmic region.

In other words, as the voltage level of the drain bias voltage Vb increases, the drain-source voltages VDS of the fourth and fifth NMOS transistors T14 and T15 are raised as well, and the fourth and fifth NMOS transistors T14 and T15 transfer the raised drain-source voltage VDS to the local data bus LIO and LIOb. In short, the fourth and fifth NMOS transistors T14 and T15 transfer the amplified data to the local data bus pair LIO and LIOb.

In this embodiment, the amplifying characteristic of an ohmic region of a MOS transistor is utilized to supply a sufficient amount of current to the local data bus LIO and LIOb.

When the drain-source voltage VDS reaches a particular level, the current value of the drain current ID does not increase anymore and becomes saturated. This region is referred to as a saturation region.

Figure 4:
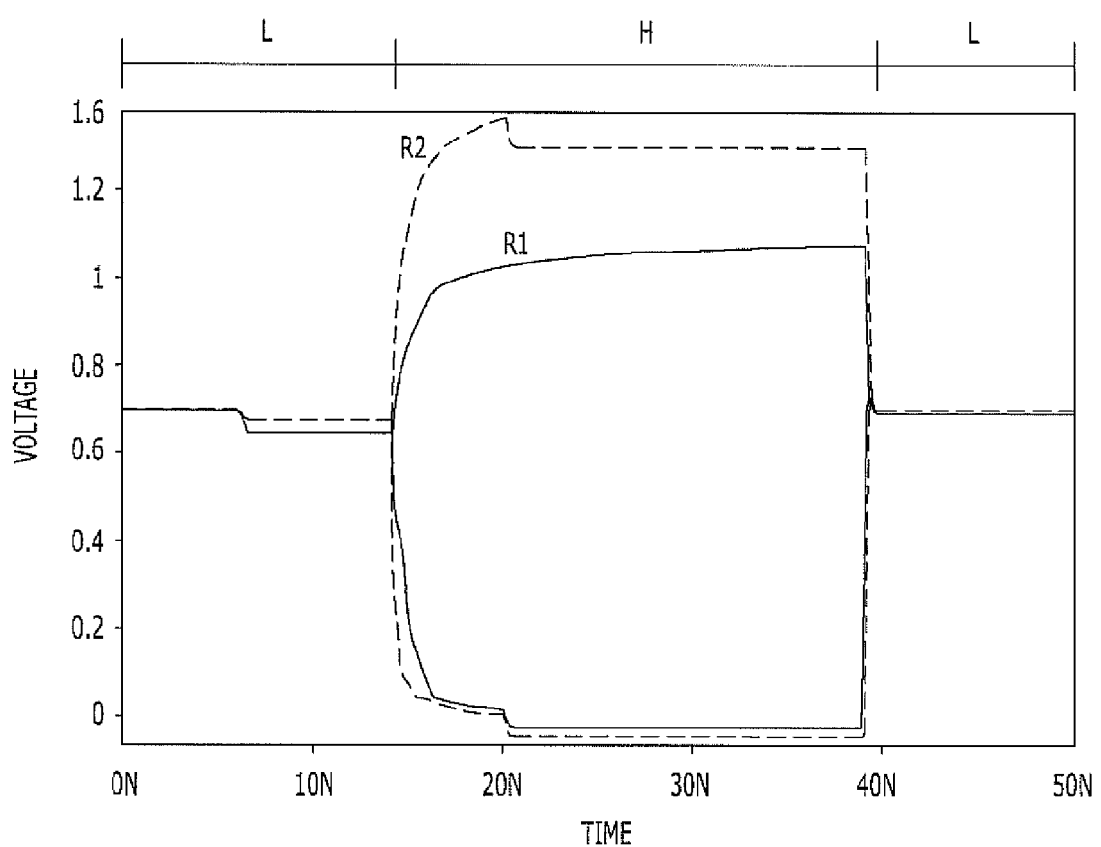
FIG. 4 shows a simulation result of the voltage level variation of local data bus LIO and LIOb in accordance with an embodiment of the present invention.

FIG. 4 shows a simulation result of the voltage level variation of the local data bus LIO and LIOb in accordance with an embodiment of the present invention.

Figure 2:
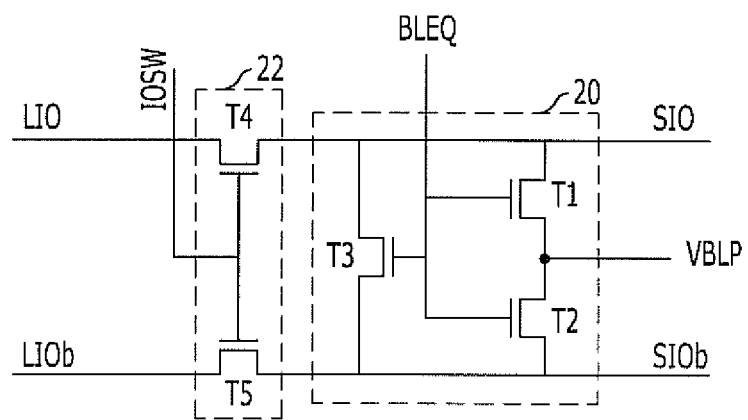
FIG. 2 is a circuit diagram of a conventional bus switch.

In the drawing, a reference symbol 'R1' denotes the voltage levels of the local data bus LIO and LIOb according to the prior art (see FIG. 2), and a reference symbol 'R2' denotes the voltage levels of the local data bus LIO and LIOb in accordance with an embodiment of the present invention.

Referring to FIG. 4, when the core voltage VCORE is approximately 1.4V and the bit line pre-charge voltage VBLP is approximately 0.7V and the drain bias voltage Vb is approximately 1.6V, the voltage levels of the local data bus LIO and LIOb corresponding to a logic low level may not be much different from the prior art. However, the voltage levels of the local data bus LIO and LIOb corresponding to a logic high level show the difference in the driving force between the embodiment of the present invention (R2) and the prior art (R1).

In short, as the voltage level of the drain bias voltage Vb increases, the current driving force of the local data bus LIO and LIOb becomes greater, and as a result, a delay that may occur when a data is transferred from the segment data bus SIO and SIOb to the local data bus LIO and LIOb may be reduced remarkably.

According to the technology of the present invention, the operation speed of a semiconductor memory device may increase by decreasing a delay occurring during the transfer of data between differential data buses.

Although the spirit and scope of the present invention have been described in detail in the above embodiment of the present invention, the embodiment of the present invention is not restrictive but illustrative.

While the present invention has been described with respect to the specific embodiments, it will be apparent to those skilled in the art that various changes and modifications may be made without departing from the spirit and scope of the invention as defined in the following claims.

For example, exemplary embodiments of the present invention have been described by taking an example of a column path of a DRAM device. However, the exemplary features of the present invention may be applied to any other memory devices having a hierarchical data bus structure.

Also, in the above embodiment, a case of transferring a data between a segment data bus and a local data bus has been described as an example. However, exemplary embodiments of the present invention may be applied to any other cases where a data is transferred from a bus having a relatively small load to a bus having a relatively great load as well.

What is claimed is:

1. A semiconductor memory device, comprising:
    a sense amplifier configured to amplify a signal loaded on a pair of bit lines and transfer a first amplified signal to a first pair of differential bus lines;
    a pre-charger configured to pre-charge the first pair of differential bus lines to a target voltage level;
    an amplifier configured to amplify a signal loaded on the first pair of the differential bus lines based on a drain bias voltage and transfer a second amplified signal to a second pair of differential bus lines; and
    a drain bias voltage generator configured to generate the drain bias voltage.

2. The semiconductor memory device of claim 1, wherein the amplifier comprises a MOS transistor and is configured to amplify the signal loaded on the first pair of the differential bus lines based on an amplifying characteristic of an ohmic region of the MOS transistor.

3. The semiconductor memory device of claim 1, wherein the first pair of the differential bus lines comprises a pair of segment data bus lines and the second pair of the differential bus lines comprises a pair of local data bus lines.

4. The semiconductor memory device of claim 1, wherein the first pair of the differential bus lines is pre-charged to a level of a bit line pre-charge voltage.

5. The semiconductor memory device of claim 4, wherein the level of the bit line pre-charge voltage is a half of a core voltage level.

6. The semiconductor memory device of claim 5, wherein a level of the drain bias voltage is higher than a level of the core voltage.

7. The semiconductor memory device of claim 1, wherein the amplifier includes an NMOS transistor having a first drain/source electrode and a gate commonly connected to a first line of the first pair of differential bus lines and a second drain/source electrode connected to the drain bias voltage generator to receive the drain bias voltage and the drain bias voltage is higher than the target voltage level.

8. A semiconductor memory device, comprising:
    a pre-charger configured to pre-charge first and second lines of a first bus to a target voltage level;
    a first NMOS transistor including a gate and a source coupled in common with the first line of the first bus and a first line of a second bus and further including a drain to receive a drain bias voltage;
    a second NMOS transistor including a gate and a source coupled in common with the second line of the first bus and a second line of the second bus and further including a drain to receive the drain bias voltage; and
    a drain bias voltage generator configured to generate the drain bias voltage.

9. The semiconductor memory device of claim 8, wherein the first bus comprises a segment data bus and the second bus comprises a local data bus.

10. The semiconductor memory device of claim 8, wherein the first NMOS transistor is configured to receive a voltage level of the first line of the first bus as a body bias voltage.

11. The semiconductor memory device of claim 10, wherein the second NMOS transistor is configured to receive a voltage level of the second line of the first bus as a body bias voltage.

12. The semiconductor memory device of claim 9, wherein the first and second lines of the first bus are pre-charged to a level of a bit line pre-charge voltage.

13. The semiconductor memory device of claim 12, wherein the level of the bit line pre-charge voltage is a half of a core voltage level.

14. The semiconductor memory device of claim 13, wherein a level of the drain bias voltage is higher than the core voltage level.

15. The semiconductor memory device of claim 14, wherein the level of the drain bias voltage is higher than the core voltage level by approximately 200 mV.

16. The semiconductor memory device of claim 14, wherein as the drain bias voltage increases, the first NMOS transistor and the second transistor are each configured to supply an increased drain-source current to a respective one of the first and second lines of the second bus.

17. The semiconductor memory device of claim 16, wherein as the drain bias voltage increases, the first NMOS transistor and the second transistor are each configured to supply the increased drain-source current to a respective one of the first and second lines of the second bus by operating in an ohmic region instead of a saturation region of a transistor.

* * * * *